United States Patent
Choi et al.

(10) Patent No.: US 7,736,975 B2
(45) Date of Patent: Jun. 15, 2010

(54) METHOD FOR MANUFACTURING NON-VOLATILE MEMORY DEVICE HAVING CHARGE TRAP LAYER

(75) Inventors: Won Joon Choi, Seoul (KR); Moon Sig Joo, Yongin-si (KR); Heung Jae Cho, Icheon-si (KR); Yong Soo Kim, Suwon-Si (KR); Sung Jin Whang, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/347,289

(22) Filed: Dec. 31, 2008

(65) Prior Publication Data
US 2009/0227116 A1 Sep. 10, 2009

(30) Foreign Application Priority Data
Mar. 5, 2008 (KR) .................. 10-2008-0020700

(51) Int. Cl.
*H01L 21/336* (2006.01)
(52) U.S. Cl. ............. 438/264; 438/584; 257/E21.679
(58) Field of Classification Search ............... 438/263, 438/264, 584; 257/E21.423, E21.679
See application file for complete search history.

(56) References Cited

U.S. PATENT DOCUMENTS

| 6,551,948 B2 | 4/2003 | Ohmi et al. |
| 7,405,125 B2 | 7/2008 | Wang |
| 2009/0163014 A1* | 6/2009 | Lee et al. ............ 438/591 |

FOREIGN PATENT DOCUMENTS

| KR | 10-2004-0012973 | 2/2004 |
| KR | 10-2005-0072979 | 7/2005 |
| KR | 10-2006-0108352 | 10/2006 |
| KR | 10-2008-0069919 | 7/2008 |

* cited by examiner

*Primary Examiner*—Thanhha Pham
(74) *Attorney, Agent, or Firm*—Marshall, Gerstein & Borun LLP

(57) ABSTRACT

A method for manufacturing a non-volatile memory device having a charge trap layer comprises in one embodiment: forming a first dielectric layer over a semiconductor substrate; forming a second dielectric layer having a higher dielectric constant than that of the first dielectric layer over the first dielectric layer; forming a nitride buffer layer for preventing an interfacial reaction over the second dielectric layer; forming a third dielectric layer by supplying a radical oxidation source onto the nitride buffer layer to oxidize the nitride buffer layer, thereby forming a tunneling layer comprising the first, second, and third dielectric layers; and forming a charge trap layer, a shielding layer, and a control gate electrode layer over the tunneling layer.

9 Claims, 6 Drawing Sheets

METHOD FOR MANUFACTURING NON-VOLATILE MEMORY DEVICE HAVING CHARGE TRAP LAYER

CROSS-REFERENCE TO RELATED APPLICATION

Priority to Korean patent application number 10-2008-0020700 filed on Mar. 5, 2008, the entire disclosure of which is incorporated by reference, is claimed.

BACKGROUND OF THE INVENTION

The invention relates generally to a semiconductor device and, more particularly, to a method for manufacturing a non-volatile memory device having a charge trap layer.

Non-volatile memory devices are electrically programmable and erasable memory devices and are widely used in electronic components which require information to be maintained even when the power is not supplied. The non-volatile memory devices may be formed having a floating gate structure and information may be programmed or erased by injecting or removing a charge in the floating gate. As the degree of integration of memory devices increases, there has been suggested a non-volatile memory device structure in which a charge is injected or removed in a charge trap layer.

In a non-volatile memory device having the charge trap layer, the charge trap layer and a blocking layer are formed on a tunneling layer formed on a semiconductor substrate and a control gate is formed on the blocking layer. Such a non-volatile memory device having the charge trap layer is suggested as a Silicon-Oxide-Nitride-Oxide-Silicon (SONOS) structure or a Metal-Aluminum Nitride-Oxide-Semiconductor (MANOS) structure depending on properties of a layer formed on the tunneling layer. A charge is stored in and discharged from the charge trap layer to carry out electrically programming and erasing operations depending on a bias applied to the non-volatile memory device formed in such a structure.

Since the injection and removal of charge carriers such as electrons and holes into or from the trap layer is carried out through the underlying tunneling layer, the behavior thereof may vary with the structure of the tunneling layer. In order to improve the tunneling operation, efforts to increase an effective dielectric constant of the tunneling layer may be considered. One of these efforts is to form the tunneling layer in a multilayer structure including a layer of a high dielectric material. However, an undesired interfacial layer having low dielectric constant, e.g. a silicate layer or a silicide layer may be excessively generated in interface between the layers in the multilayer structure. This interfacial layer of low dielectric constant may lead to reduction in total effective dielectric constant of the tunneling layer, and generation of the interfacial layer may cause undesirable, excessively increased roughness of the layers. Therefore, the properties of entire tunneling layer as well as operation properties of the memory cell may deteriorate.

SUMMARY OF THE INVENTION

In one embodiment of the invention, a method for manufacturing a non-volatile memory device having a charge trap layer comprises: forming a first dielectric layer over a semiconductor substrate; forming a second dielectric layer having a higher dielectric constant than that of the first dielectric layer over the first dielectric layer; forming a nitride buffer layer for preventing an interfacial reaction over the second dielectric layer; forming a third dielectric layer by supplying a radical oxidation source onto the nitride buffer layer to oxidize the nitride buffer layer, thereby forming a tunneling layer comprising the first, second, and third dielectric layers; and forming a charge trap layer, a shielding layer, and a control gate electrode layer over the tunneling layer.

The first dielectric layer preferably comprises a silicon oxide layer.

The second dielectric layer preferably comprises at least one material selected from the group consisting of AlO, HfO, ZrO, HfSiO, HfSiON, HfAlO, and HfAlON.

The nitride buffer layer is preferably formed by depositing a silicon nitride layer over the second dielectric layer.

Forming the third dielectric layer preferably comprises: loading the semiconductor substrate formed with the silicon nitride layer into a heat treating chamber; and supplying hydrogen ($H_2$)-containing gas and oxygen ($O_2$)-containing gas into the heat treating chamber and burning the gases to induce a radical oxidation reaction by radical oxidation species generated upon combustion of the hydrogen and oxygen, thereby substituting the silicon nitride layer with an oxide layer by the radical oxidation reaction.

The silicon nitride layer is preferably substituted with a silicon oxynitride layer or a silicon oxide layer by the radical oxidation reaction.

The silicon nitride layer is preferably formed in a thickness of 10 Å to 40 Å.

In another embodiment, a method for manufacturing a non-volatile memory device having a charge trap layer includes: forming a silicon oxide layer over a semiconductor substrate; forming a high-k dielectric layer including a high-k material (i.e., one having a relatively high dielectric constant) over the silicon oxide layer; forming a silicon nitride layer as an interfacial reaction barrier layer over the high-k dielectric layer; supplying hydrogen ($H_2$)-containing gas and oxygen ($O_2$)-containing gas onto the silicon nitride layer and burning the gases to induce a radical oxidation reaction by radical oxidation species generated upon the combustion and oxidate the silicon nitride layer by the radical oxidation reaction, thereby forming a tunneling layer comprising the silicon oxide layer, the high-k dielectric layer, and the oxide layer; and forming a charge trap layer, a shielding layer, and a control gate electrode layer over the tunneling layer.

The silicon nitride layer preferably has a charge trap layer which is substituted with a silicon oxynitride layer or a silicon oxide layer by the radical oxidation reaction.

DESCRIPTION OF SPECIFIC EMBODIMENTS

In a method for manufacturing a non-volatile memory device having a charge trap layer in accordance with an embodiment of the invention, a tunneling layer is formed in a multilayer structure including a dielectric material layer of a high dielectric constant, i.e. a high-k material layer. At this time, in order to inhibit excessive generation of an undesired interfacial layer having a relatively low dielectric constant in an interface between the high-k material layer and another, overlying dielectric material layer, a process of depositing a silicon nitride layer in a thin thickness (less than tens of Å) over the high-k material layer is utilized. The silicon nitride layer inhibits diffusion of oxygen from hafnium oxide ($HfO_2$) or zirconium oxide (ZrO) or similar materials which are typically used as the high-k material layer and thus inhibits generation of the interfacial layer of silicate or silicide having a relatively low dielectric constant. After that, the silicon nitride layer is oxidized using a process such as In-Situ Steam Generated ("ISSG") radical oxidation. When the charge trap layer is formed directly over the silicon nitride layer, interfacial properties such as interfacial adhesion to the charge trap layer may be fairly weak. The interfacial properties to the succeeding charge trap layer can be improved by oxidizing the silicon nitride layer with the oxidation process.

As described above, the silicon nitride layer is formed over the high-k material layer and is substituted with an oxide layer using the ISSG oxidation method when forming the tunneling layer, thereby preventing the interfacial layer from being formed between the high-k material layer and the oxide layer. Therefore, it is possible to prevent the problems associated with an increase in Capacitance Equivalent Thickness (CET) of the tunneling layer, a charge trap effect, deterioration in data retention properties, and deterioration in programming and erasing properties of the non-volatile memory device which are resulted by the interfacial layer.

Figure 1:
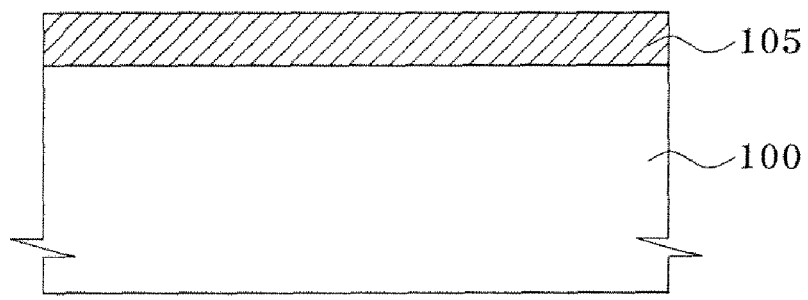
FIGS. 1 through 7 illustrate a method for manufacturing a non-volatile memory device having a charge trap layer in accordance with an embodiment of the invention.

Referring to FIG. 1, a first dielectric layer is 105 is formed over a semiconductor substrate 100. The tunneling layer illustratively employs a multilayer structure including a dielectric layer of high-k material instead of a single layer structure formed of a silicon oxide layer. The first dielectric layer 105 is preferably formed of a silicon oxide ($SiO_2$) layer in a thickness of 10 Å to 30 Å. The first dielectric layer 105 is preferably formed by thermal oxidation or radical oxidation.

Figure 2:
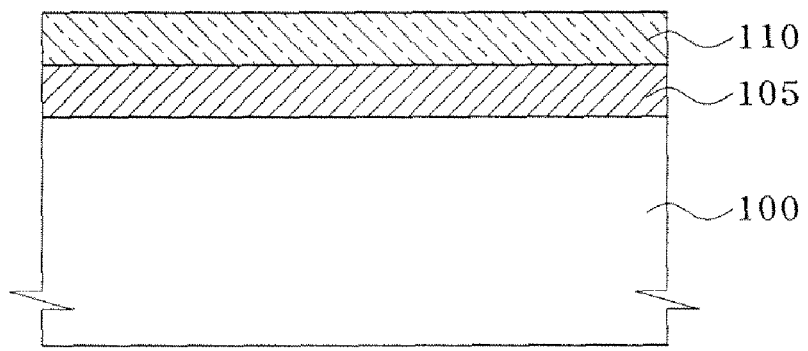

Referring to FIG. 2, a second dielectric layer 110 comprising a material having a higher k than that of the first dielectric layer 105 is formed over the first dielectric layer 105. The second dielectric layer 110 formed over the first dielectric layer 105 is preferably formed of at least one material selected from the group consisting of AlO, HfO, ZrO, HfSiO, HfSiON, HfAlO, and HfAlON, which are high-k materials. Herein, the second dielectric layer 110 is preferably formed in a thickness of 10 Å to 100 Å.

Figure 3:
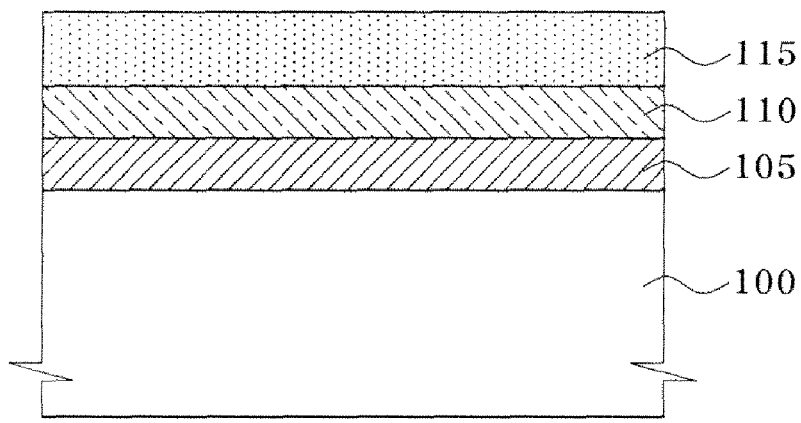
Figure 8:
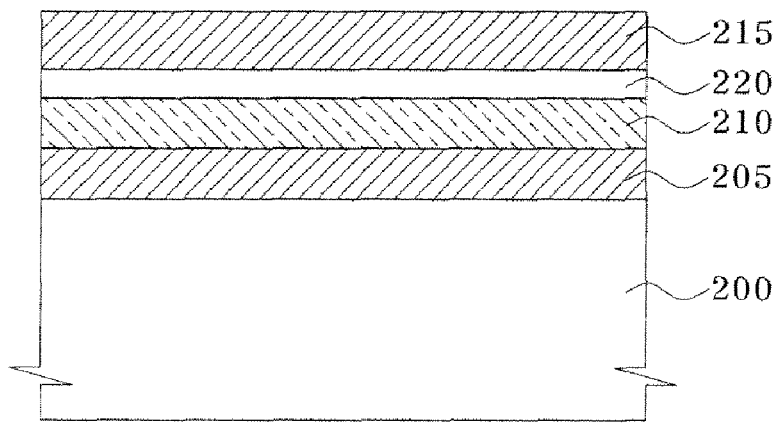
FIG. 8 illustrates a problem resulting when forming a tunneling layer in a three-layer structure.

Referring to FIG. 3, a nitride buffer layer 115 is formed over the second dielectric layer 110. The nitride buffer layer 115 is preferably formed of a silicon nitride layer (SiN), preferably in a thickness of 10 Å to 40 Å. As described above, the tunneling layer illustratively employs a multilayer structure, e.g. a three layer structure, including a dielectric layer of high-k material instead of a single layer structure formed of a silicon oxide layer. However, an interfacial layer is formed by an interfacial reaction between a thin film and a thin film in the case of forming the tunneling layer of the multilayer structure. Referring to FIG. 8, in the case of forming the tunneling layer of the three layer structure, a silicon oxide layer 215 may be considered to be formed over a high-k material layer 210. Herein, the high-k material layer 210 is preferably formed of hafnium oxide (HfO) layer. The silicon oxide layer 215 is preferably formed by a Chemical Vapor Deposition (CVD) process or a Physical Vapor Deposition (PVD) process. In the case of forming the silicon oxide layer 215 over the high-k material layer 210, i.e. hafnium oxide layer, chemical reaction due to diffusion of oxygen and silicon may proceed between the hafnium oxide layer and the silicon oxide layer 215. An interfacial layer 220 such as a silicate layer and a silicide layer, for example, which illustratively includes a hafnium silioxide layer, then may be formed in an interface between the hafnium oxide layer and the silicon oxide layer. Such formation of the interfacial layer 220 between high-k material layer 210 and the silicon oxide layer 215 lowers the dielectric constant as compared to the single layer of a high-k material layer. Also, the formation of the interfacial layer results in a problem that CET of the tunneling layer is increased. Further, the formation of the interfacial layer 220 results in problems that a surface roughness between the high-k material layer 210 and the silicon oxide layer 215 is increased and electrical properties of the device also deteriorate due to generation of charge trap.

Therefore, in an embodiment of the invention, the nitride buffer layer 115, which is a reaction barrier layer, is formed over the second dielectric layer 110 including high-k material to prevent the interfacial layer 220 from being formed. Formation of the silicon nitride layer as the nitride buffer layer 115 inhibits reaction with the second dielectric layer 110 including high-k material, thereby capable of preventing the interfacial layer from being formed.

Figure 4:
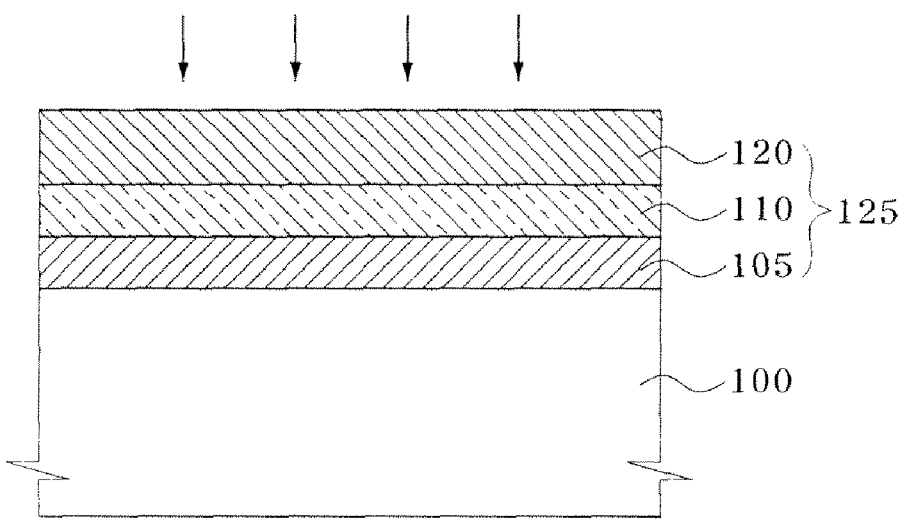

Referring to FIG. 4, an oxidation treatment is carried out over the nitride buffer layer 115 (refer to FIG. 3) to substitute the nitride buffer layer 115 with a third dielectric layer 120, preferably including oxide. The third dielectric layer 120 is preferably formed of a silicon oxide ($SiO_2$) layer or a silicon oxynitride (SiON) layer. An ISSG oxidation method is preferably employed as the oxidation treatment carried out in an embodiment of the invention. The ISSG oxidation method is a method in which hydrogen ($H_2$)-containing gas and oxygen ($O_2$)-containing gas are supplied onto a target layer to be oxidized to induce a radical oxidation reaction. Specifically, the semiconductor substrate 100 formed with the nitride buffer layer 115 is loaded in a heat treating chamber. Next, heat treatment is carried while supplying hydrogen ($H_2$)-containing gas and oxygen ($O_2$)-containing gas into the heat treating chamber to induce a radical oxidation reaction which generates oxygen radicals. The mechanism of the ISSG oxidation method is an oxidation by radical oxidation species generated from combustion of hydrogen and oxygen. Oxidation treatment by general heat treatment, e.g. Rapid Thermal Process (RTP) is an on-atom oxidation. In the on-atom oxidation, oxidation is carried out by direct participation of active oxidation species on atoms. In the ISSG oxidation method, the reaction is carried out by vapor generated from the reaction in the heat treating chamber of nitride buffer layer 115 with hydrogen ($H_2$)-containing gas and oxygen ($O_2$)-containing gas supplied into the heat treating chamber. At this time, the ISSG oxidation method is characterized in that an oxide is grown even on the nitride. Therefore, as nitrogen in the silicon nitride layer is substituted with oxygen in the oxygen radical by the ISSG oxidation method, the nitride buffer layer 115 is converted into the third dielectric layer 120 including an oxide. The third dielectric layer 120 is here formed of a silicon oxide ($SiO_2$) layer or a silicon oxynitride (SiON) layer. The third dielectric layer 120 is preferably formed of a silicon oxide layer when the silicon nitride layer is completely oxidized, or else is formed of a silicon oxynitride layer. Also, the third dielectric layer 120 is preferably formed in the form of a thin film over the surface of the silicon nitride layer. Therefore, a tunneling layer 125 having a three-layer structure of the first dielectric layer 105, the second dielectric layer 110 including high-k materials and the third dielectric layer 120. The layer quality of the oxide layer formed by the ISSG oxidation method is superior since its band gap properties are higher than those of a High Temperature Oxide (HTO) layer or a Tetra Ethyl Ortho Silicate (TEOS) layer.

Figure 9A:
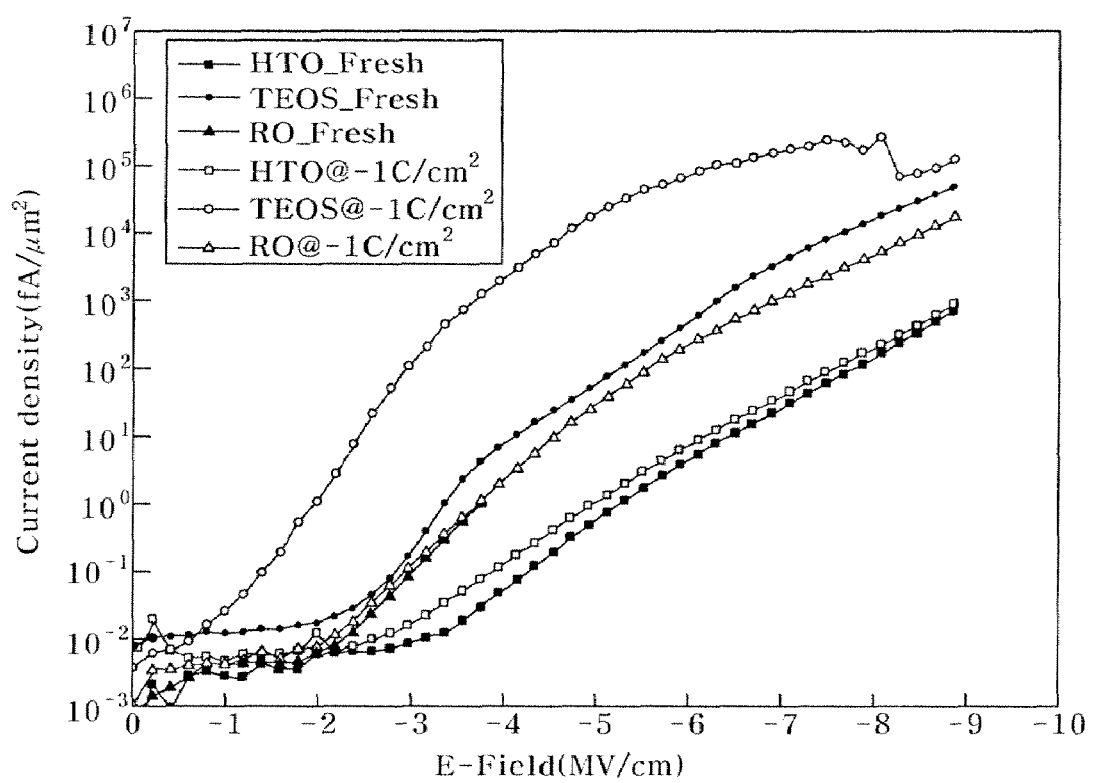
FIGS. 9A through 9C illustrate electrical properties depending on kinds of oxide layers.
Figure 9B:
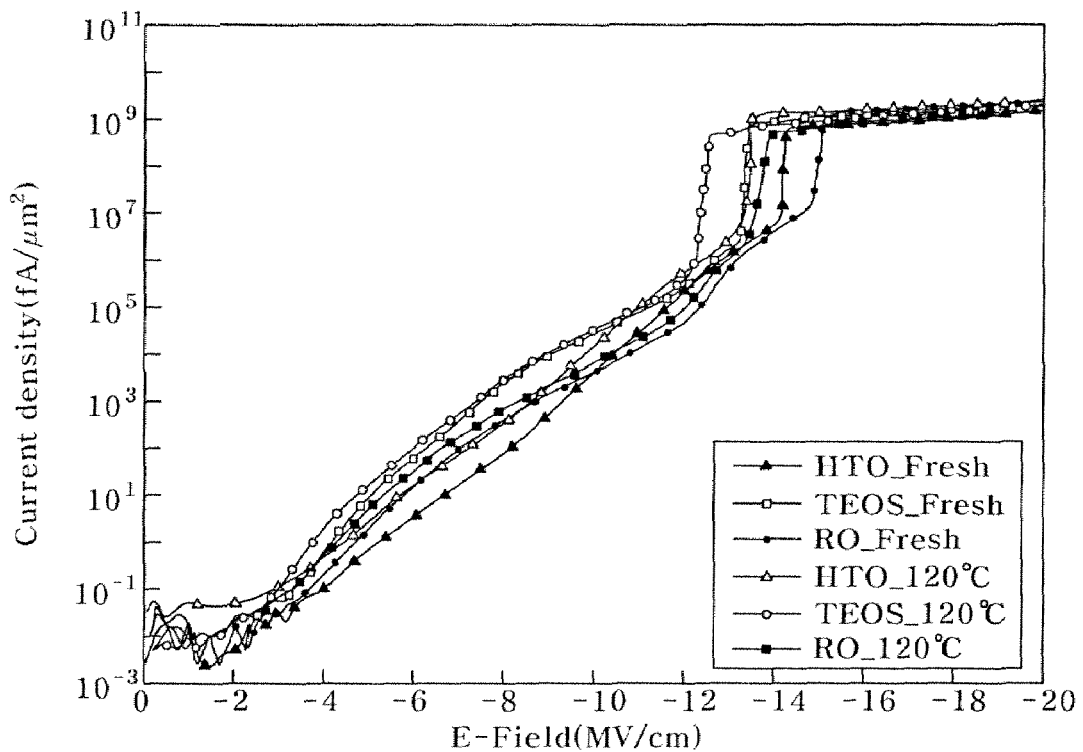
Figure 9C:
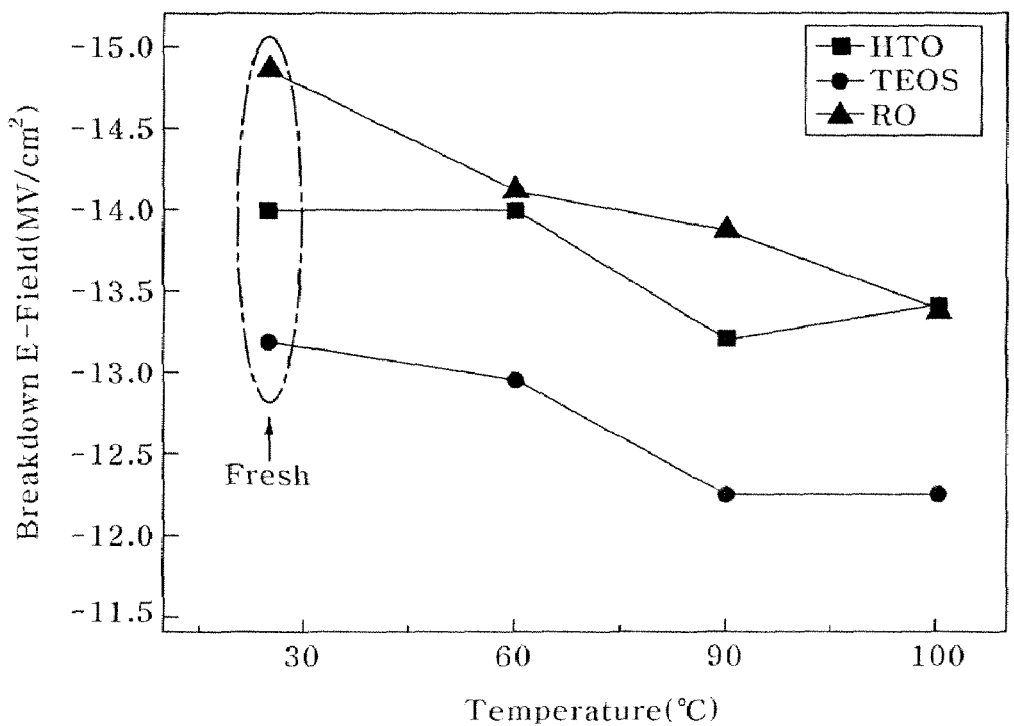

Such ISSG oxidation method has superior properties to electrical stress, thermal stress, and breakdown voltage as compared to general oxidation method such as a high thermal oxidation. Referring to data representing the electrical properties depending on kinds of the oxide layer, the oxide layer RO formed by the ISSG oxidation method is measured to show lower electrical stress than the HTO layer as shown in FIG. 9A. Also, referring to data representing breakdown voltage properties depending on kinds of the oxide layer, the oxide layer RO formed by the ISSG oxidation method is measured to have the best breakdown voltage properties with increase in temperature as shown in FIG. 9C. Further, as shown in FIG. 9B which is data with respect to the thermal stress with increase in temperature, the oxide layer RO formed by the ISSG oxidation method is measured to have superior properties to the thermal stress even with increase in temperature. In the case that the third dielectric layer 120 including an oxide is formed over the second dielectric layer 110 including high-k material, as the third dielectric layer 120 is formed with the formation of the silicon oxide being inhibited by the silicon nitride layer, the interfacial reaction between the second dielectric layer 110 and the third dielectric layer 120 does not occur even when during subsequent processes.

Figure 5:
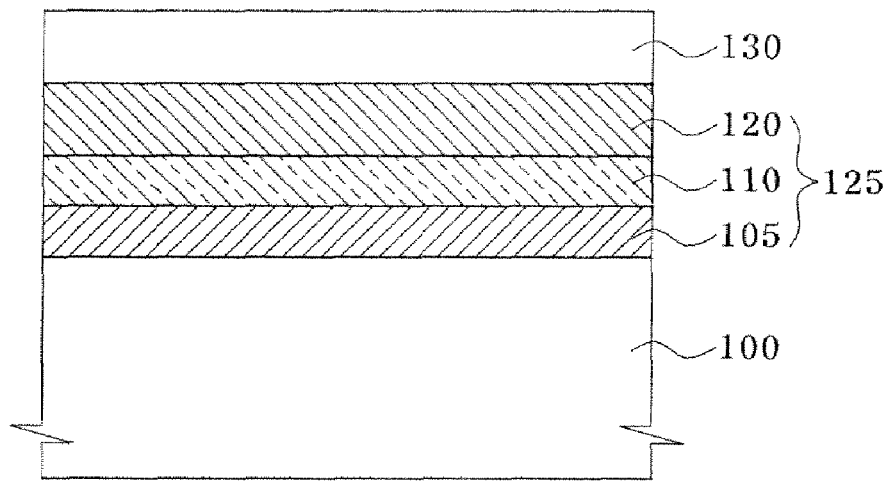

Referring to FIG. 5, a charge trap layer 130 is formed over the tunneling layer 125. The charge trap layer 130 is a layer which traps electrons or holes injected through the tunneling layer 125, and a programming and erasing speed of the device is increased since the charge trap is better accomplished as the energy level is more uniform and the number of the trap site is larger. The charge trap layer 130 is preferably formed of a silicon nitride layer, preferably in a thickness of 10 Å to 40 Å.

Figure 6:
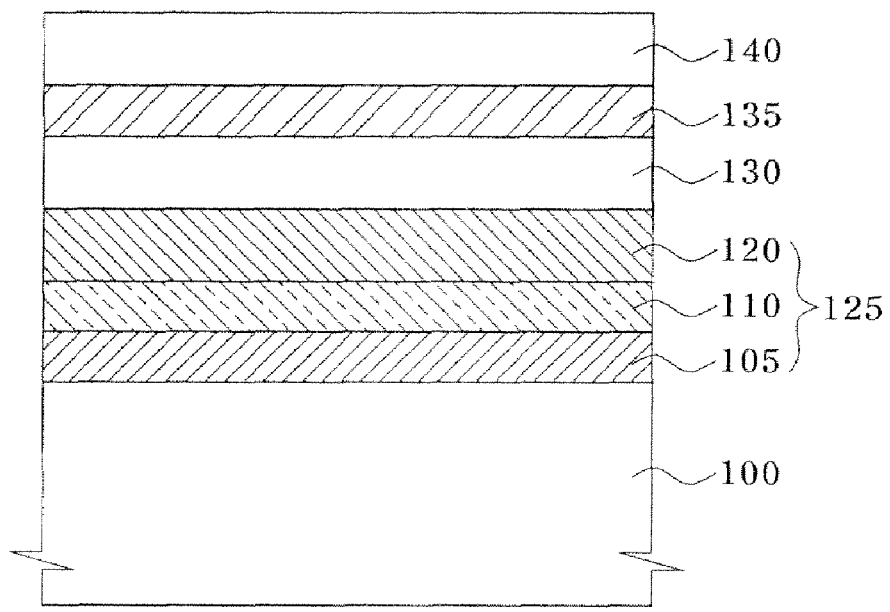

Referring to FIG. 6, a shielding layer 135 is formed by depositing a high-k material over the charge trap layer 130. A control gate electrode 140 is successively formed over the shielding layer 135. The shielding layer 135 here acts to block the charges to move toward the control gate electrode 140. The control gate electrode 140 acts to apply a bias having a predetermined level so that electrons or holes from a channel region of the semiconductor substrate 100 are trapped in the trap sites in the charge trap layer 130. A low resistance layer, though not shown, may be formed over the control gate electrode 140 to lower a specific resistance of the gate electrode.

Figure 7:
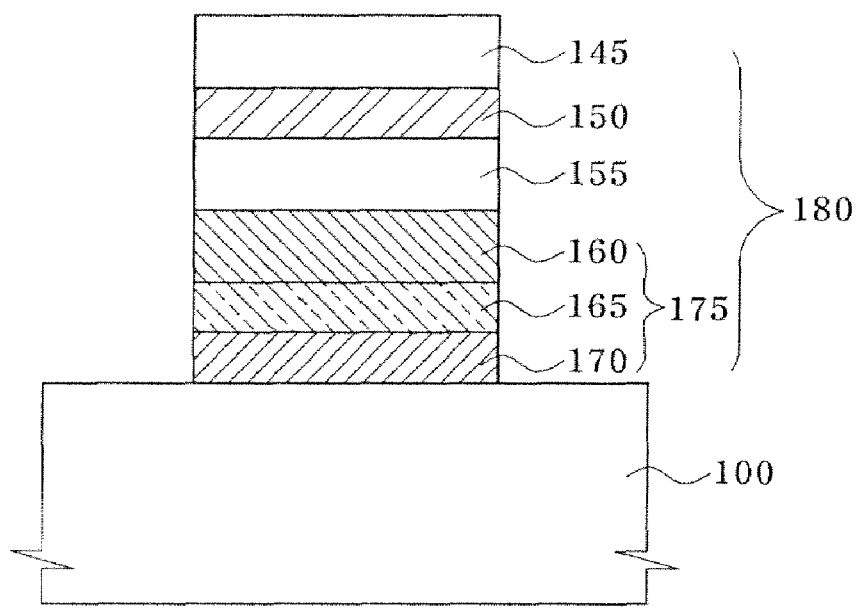

Referring to FIG. 7, a gate stack 180 is formed by patterning the control gate electrode 140, the shielding layer 135, the charge trap layer 130 and the tunneling layer. Specifically, a mask layer pattern (not shown) which defines a gate stack forming region is formed over the control gate electrode 140. Next, the gate stack 180 is formed by carrying out an etch process using the mask layer pattern as a mask. Herein, the gate stack 180 includes a tunneling layer pattern 175, a charge trap layer pattern 155, a shielding layer pattern 150, and a control gate electrode pattern 145. At this time, the tunneling pattern 175 is has a structure in which a first dielectric layer pattern 170, a second dielectric layer pattern 165, and a third dielectric layer pattern 160 are stacked.

While the preferred embodiment of the invention has been described with respect to a non-volatile memory device provided with a charge trap layer, the invention may be applied to all devices employing a tunneling layer. For example, the invention may be applied to a non-volatile memory device provided with a floating gate.

What is claimed is:

1. A method for manufacturing a non-volatile memory device having a charge trap layer, the method comprising:

forming a first dielectric layer over a semiconductor substrate;

forming a second dielectric layer having a higher dielectric constant than that of the first dielectric layer over the first dielectric layer;

forming a nitride buffer layer for preventing an interfacial reaction over the second dielectric layer;

forming a third dielectric layer over the nitride buffer layer by supplying a radical oxidation source onto the nitride buffer layer to oxidize the nitride buffer layer, thereby forming a tunneling layer comprising the first, second, and third dielectric layers; and sequentially forming a charge trap layer, a shielding layer, and a control gate electrode layer over the tunneling layer.

2. The method of claim 1, wherein the first dielectric layer comprises a silicon oxide layer.

3. The method of claim 1, wherein the second dielectric layer comprises at least one material selected from the group consisting of AlO, HfO, ZrO, HfSiO, HfSiON, HfAlO, and HfAlON.

4. The method of claim 1, comprising forming the nitride buffer layer by depositing a silicon nitride layer over the second dielectric layer.

5. The method of claim 4, comprising forming the third dielectric layer by:

loading the semiconductor substrate formed with the silicon nitride layer into a heat treating chamber; and supplying hydrogen ($H_2$)-containing gas and oxygen ($O_2$)-containing gas into the heat treating chamber and burning said gases to induce a radical oxidation reaction by radical oxidation species generated upon combustion of the hydrogen and oxygen, thereby substituting the silicon nitride layer with an oxide layer by the radical oxidation reaction.

6. The method of claim 5, comprising substituting the silicon nitride layer with a silicon oxynitride layer or a silicon oxide layer by the radical oxidation reaction.

7. The method of claim 5, comprising forming the silicon nitride layer in a thickness of 10 Å to 40 Å.

8. A method for manufacturing a non-volatile memory device having a charge trap layer, comprising:

forming a silicon oxide layer over a semiconductor substrate;

forming a high-k dielectric layer comprising a high-k material having a dielectric constant higher than that of the silicon oxide layer over the silicon oxide layer;

forming a silicon nitride layer as an interfacial reaction barrier layer over the high-k dielectric layer;

supplying hydrogen ($H_2$)-containing gas and oxygen ($O_2$)-containing gas onto the silicon nitride layer and burning them to induce radical oxidation reaction by radical oxidation species generated upon the combustion and oxidize the silicon nitride layer by the radical oxidation reaction, thereby forming a tunneling layer comprising the silicon oxide layer, the high-k dielectric layer, and the oxide layer; and forming a charge trap layer, a shielding layer, and a control gate electrode layer over the tunneling layer.

9. The method of claim 8, wherein the silicon nitride layer comprises a charge trap layer which is substituted with a silicon oxynitride layer or a silicon oxide layer by the radical oxidation reaction.

* * * * *